(12) United States Patent
Breitlow et al.

(10) Patent No.: US 10,908,196 B2
(45) Date of Patent: Feb. 2, 2021

(54) SYSTEM AND METHOD FOR CONTROLLING POWER TO A HEATER

(71) Applicant: Watlow Electric Manufacturing Company, St. Louis, MO (US)

(72) Inventors: Stanton Hopkins Breitlow, Winona, MN (US); James Hentges, Winona, MN (US); William Bohlinger, Winona, MN (US); Matthew Yender, St. Louis, MO (US); Keith Ness, St. Louis, MO (US); Kurt Peterson, LaCrosse, WI (US); Eric Meech, St. Louis, MO (US); Brittany Phillips, Saint Louis, MO (US); Larry Walters, St. Louis, MO (US); Geoffrey Rozek, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 16/401,937

(22) Filed: May 2, 2019

(65) Prior Publication Data
US 2019/0257861 A1 Aug. 22, 2019

Related U.S. Application Data

(63) Continuation of application No. 16/100,585, filed on Aug. 10, 2018, which is a continuation-in-part of (Continued)

(51) Int. Cl.
*H05B 1/02* (2006.01)
*G01R 19/22* (2006.01)
(Continued)

(52) U.S. Cl.
CPC ........ *G01R 19/225* (2013.01); *F24D 11/0207* (2013.01); *G01R 19/16519* (2013.01);
(Continued)

(58) Field of Classification Search
CPC ............ G01R 19/225; G01R 19/16519; G01R 19/257; H01L 21/67248; H01L 21/67115;
(Continued)

(56) References Cited

U.S. PATENT DOCUMENTS 4,540,866 A 9/1985 Okuda
4,549,073 A * 10/1985 Tamura .............. G05D 23/2401
219/492

(Continued)

FOREIGN PATENT DOCUMENTS

WO 2001052602 7/2001
WO 2015016885 2/2015

*Primary Examiner* — Mark H Paschall
(74) *Attorney, Agent, or Firm* — Burris Law, PLLC

(57) ABSTRACT

The present disclosure is directed toward a control system for controlling a heater that includes at least one heating element. The control system includes a power converter operable to supply an adjustable voltage output to the heater, a sensor circuit that measures an electrical characteristic of the heating element of the heater, a reference temperature sensor that measures a reference temperature of a reference at the heater, and a controller. The controller is configured to calculate a primary temperature of a heater element based on the electrical characteristic and determines the voltage output to be applied to the heater based on at least one of the reference temperature and the primary temperature. The controller is configured to operate in at least one of an operation mode and a learn mode, and execute protection protocols when voltage is being supplied to the heater.

15 Claims, 10 Drawing Sheets

Related U.S. Application Data application No. 15/624,060, filed on Jun. 15, 2017, now Pat. No. 10,690,705.

(60) Provisional application No. 62/543,457, filed on Aug. 10, 2017, provisional application No. 62/350,275, filed on Jun. 15, 2016.

(51) Int. Cl.
  *F24D 11/02* (2006.01)
  *G01R 19/165* (2006.01)
  *H01L 21/67* (2006.01)
  *G01R 19/257* (2006.01)

(52) U.S. Cl.
  CPC ..... *H01L 21/67248* (2013.01); *H05B 1/0283* (2013.01); *G01R 19/257* (2013.01); *H01L 21/67115* (2013.01); *H05B 2203/014* (2013.01)

(58) Field of Classification Search
  CPC . F24D 11/0207; H05B 1/0283; H05B 1/0233; H05B 2203/013
  USPC ....... 219/494, 202, 204, 497, 499, 505, 542, 219/483–486
  See application file for complete search history.

(56) References Cited

U.S. PATENT DOCUMENTS

| | | | | |
|---|---|---|---|---|
| 5,105,067 | A * | 4/1992 | Brekkestran | G05D 23/2401 2/69 |
| 6,812,436 | B2 * | 11/2004 | Nomura | G01N 27/4067 219/202 |
| 8,064,233 | B2 | 11/2011 | Ishizu et al. | |
| 8,160,433 | B2 * | 4/2012 | Bedingfield | A61M 5/445 361/160 |
| 8,552,346 | B2 * | 10/2013 | Ambal | H01L 21/67103 118/50.1 |
| 2011/0174801 | A1 * | 7/2011 | Schwerman | H03K 7/10 219/509 |
| 2011/0206358 | A1 | 8/2011 | Goldin et al. | |
| 2013/0287377 | A1 * | 10/2013 | Serebryanov | H01L 21/67115 392/411 |
| 2014/0124498 | A1 * | 5/2014 | Barfield | H02J 7/0029 219/497 |

* cited by examiner

| State Model Control 1: __POWER-UP__ |||
|---|---|---|
| Setting | Value/ Condition | Units/ Comments |
| Power Rate Set-Point | 2 | %/min |
| Exit Cond. 1 | $H_{EC} > TH_{PWR\text{-}UP}$ | |
| Next State | State Model 2 | |

FIG. 5A

| State Model Control 3: <u>RATE</u> | | |
|---|---|---|
| Setting | Value/Condition | Units/Comments |
| Rate Set-Point | 12 | °C/min |
| PB | 200 | °C |
| Ti | 30.0 | sec |
| Td | 0 | sec |
| Start Action | None | |
| Exit Cond. | Close to SP | |
| Rel. Param | 1.0 | °C |
| Next State | State Model 4 | |

FIG. 5C

| State Model Control 2: <u>SOFT START</u> | | |
|---|---|---|
| Setting | Value/Condition | Units/Comments |
| Rate | 0.5 | %/min |
| Initial Power | 0 | % |
| Max Power | 5 | % |
| Exit Con. 1 | $V_{O/P} > 5\%$ | |
| Next State | State Model 3 | |

FIG. 5B

| State Model Control 4: PID-1 | | |
|---|---|---|
| Setting | Value/Condition | Units/Comments |
| PB | 100 | °C |
| Ti | 40 | sec |
| Td | 0 | sec |
| Start Action | None | |
| Exit Cond. 1 | SP Up | |
| Rel. Param 1 | 10.0 | °C |
| Next State | State Model 3 | |
| Exit. Cond. 2 | SP Down | |
| Rel. Param 2 | 10.0 | °C |
| Next State | State Model 5 | |

FIG. 5D

| State Model Control 5: PID-2 | | |
|---|---|---|
| Setting | Value/Condition | Units/Comments |
| PB | 44.4 | °C |
| Ti | 180 | sec |
| Td | 0 | sec |
| Start Action | Set | |
| Scale | 0 | %/°C |
| Offset | 0.00 | % |
| Constant | 5.0 | % |
| Exit Cond. 1 | Far From SP | |
| Rel. Param 1 | 5 | °C |
| Next State | State Model 6 | |
| Exit. Cond. 2 | Time | |
| Abs Param. 2 | 40.0 | sec |
| Next State | State Model 4 | |

FIG. 5E

SYSTEM AND METHOD FOR CONTROLLING POWER TO A HEATER

CROSS-REFERENCE TO RELATED APPLICATIONS

This application is a continuation of U.S. application Ser. No. 16/100,585, filed on Aug. 10, 2018, which claims the benefit of and priority to U.S. Provisional Application No. 62/543,457, filed Aug. 10, 2017, and is a continuation-in-part application of U.S. Ser. No. 15/624,060, filed Jun. 15, 2017, and titled "POWER CONVERTER FOR A THERMAL SYSTEM," which claims benefit of U.S. Provisional Application No. 62/350,275, filed Jun. 15, 2016. The disclosures of the above applications are incorporated herein by reference.

FIELD

The present disclosure relates to a system and/or method for controlling a thermal system having a heater.

BACKGROUND

The statements in this section merely provide background information related to the present disclosure and may not constitute prior art.

Generally, a heater, such as a pedestal heater for heating a load, includes heating elements that are controlled by a control system. For example, a pedestal heater includes a heating plate that has a ceramic substrate and a plurality of resistive heating elements embedded in the ceramic substrate to define a plurality of heating zones. Typically, the same power is applied to the plurality of resistive heating elements at the same ramp rate during heater startup.

Despite the same power applied to the resistive heating elements, some resistive heating elements may be heated faster than other heating elements due to, for example, the position of the heating zones relative to heat sinks, and differences in the characteristics of the heating zones caused by non-uniform manufacturing. When a heating zone is heated faster than an adjacent heating zone, the temperature difference between the adjacent heating zones causes different thermal expansion and consequently thermal stress between the adjacent heating zones. Significant thermal stress may result in generation of thermal cracks in the ceramic substrate. These and other issues are addressed by the present disclosure.

SUMMARY

This section provides a general summary of the disclosure, and is not a comprehensive disclosure of its full scope or all of its features.

In one form, the present disclosure is directed toward a control system for controlling a heater that includes at least one heating element. The control system includes a power converter, a sensor circuit, a reference temperature sensor, and a controller. The power converter is operable to supply a voltage output that is adjustable to the heater, and is configured to convert a voltage input from a power source to the voltage output that is less than or equal to the voltage input. The sensor circuit is configured to measure an electrical characteristic of the heating element of the heater, where the electrical characteristic includes at least one of an electric current and a voltage. The reference temperature sensor measures a reference temperature of a reference at the heater. The controller is configured to operate the power converter to control the voltage output to the heater. The controller is configured to calculate a primary temperature of a heater element based on the electrical characteristic and determines the voltage output to be applied to the heater based on at least one of the reference temperature and the primary temperature. The controller is configured to operate in at least one of an operation mode and a learn mode, and execute one or more protection protocols when the voltage output is being supplied to the heater.

In another form, the controller is configured to reduce or shut-off power to the heater in response to a difference between the reference temperature and the primary temperature being greater than a preset threshold.

In yet another form, the reference temperature sensor is one of an infrared camera, a thermocouple, and a resistance temperature detector.

In one form, in the learn mode, the controller is configured to operate the heater to generate a heater-load correlation data that associates a temperature of a heater element with a temperature of a load positioned on the heater.

In another form, in the learn mode, the controller is configured to gradually increase the power to the heater to increases the heat generated by the heater, determine a plurality of the primary temperatures, and correlate the primary temperatures with respective reference temperatures detected by the reference temperature sensor to generate the heater-load correlation data.

In yet another form, the controller is configured to map the change of the primary temperature and the reference temperature over a period time during which the power is being increased.

In one form, the reference temperature sensor is configured to measure a temperature of at least one of a load positioned on the heater and a surface of the heater.

In another form, in the operation mode, the controller is configured to execute a boost compensation to increase a rate at which the heating elements generate heat to heat the reference to a predefined set-point temperature.

In yet another form, the controller is configured to determine the primary temperature for each of the heating elements based on the electrical characteristic, and for adjacent zones, adjust power supplied to one or more heating elements of the adjacent zones based on the primary temperatures to control temperature variation across the heater.

In one form, the controller is configured to reduce power to one zone in response to the one zone having a higher temperature than that of an adjacent zone.

In another form, in the operation mode, the controller is configured to select a state model control, as an operation state of the heater, from among a plurality of defined state model controls, based on at least one of the reference temperature and the primary temperature.

In yet another form, the plurality of defined state model controls includes at least one of a power-up control, a soft start control, a set rate control, and a steady-state control.

In one form, each of the state model controls defines one or more operation settings for controlling the heater for the respective state model control.

In another form, the one or more operation settings includes a transition condition that defines a condition for exiting the operation state to one other state model control.

In yet another form, the present disclosure is a thermal system that includes the heater and the control system as described above.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 4:
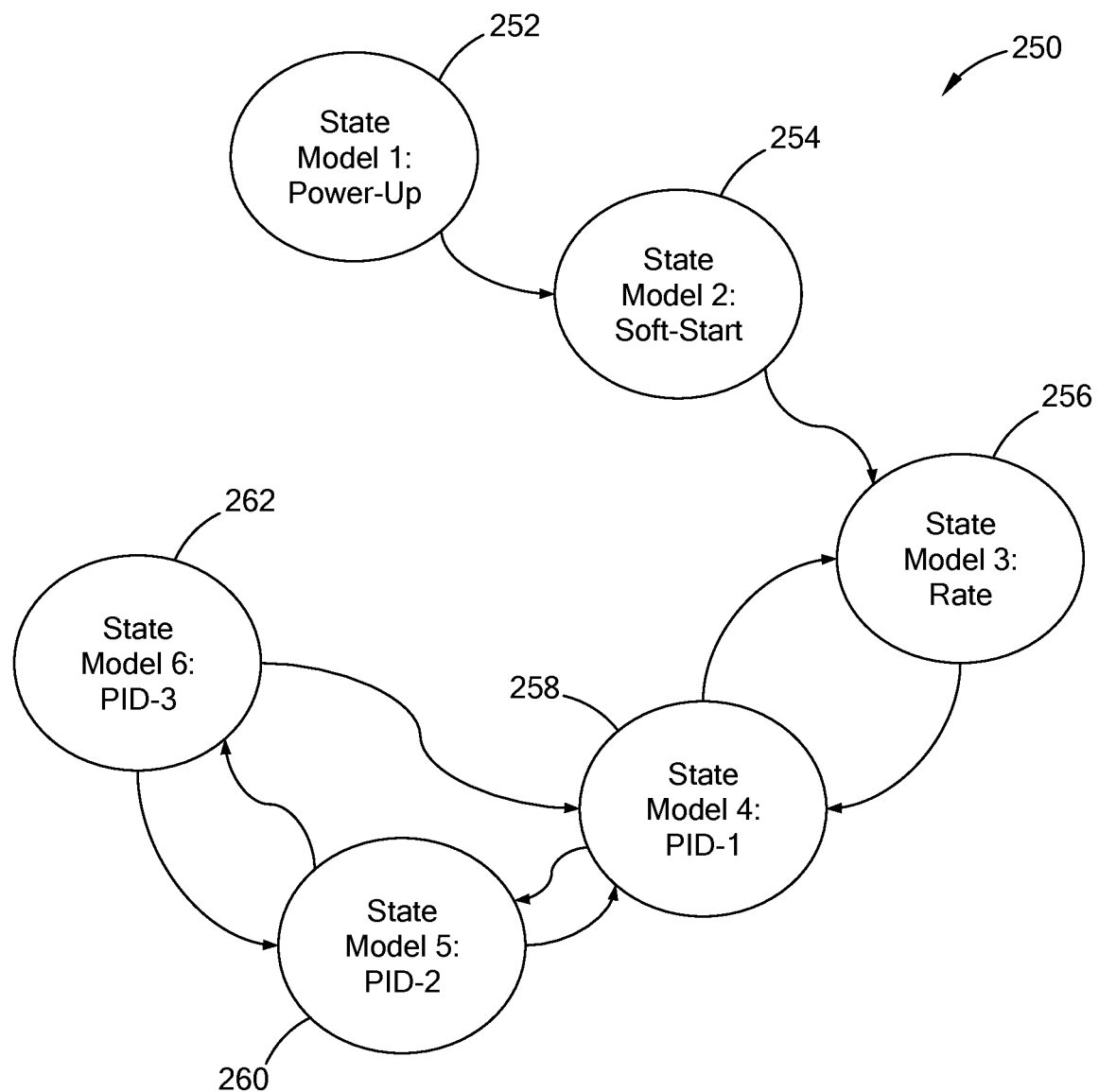
Figure 6:
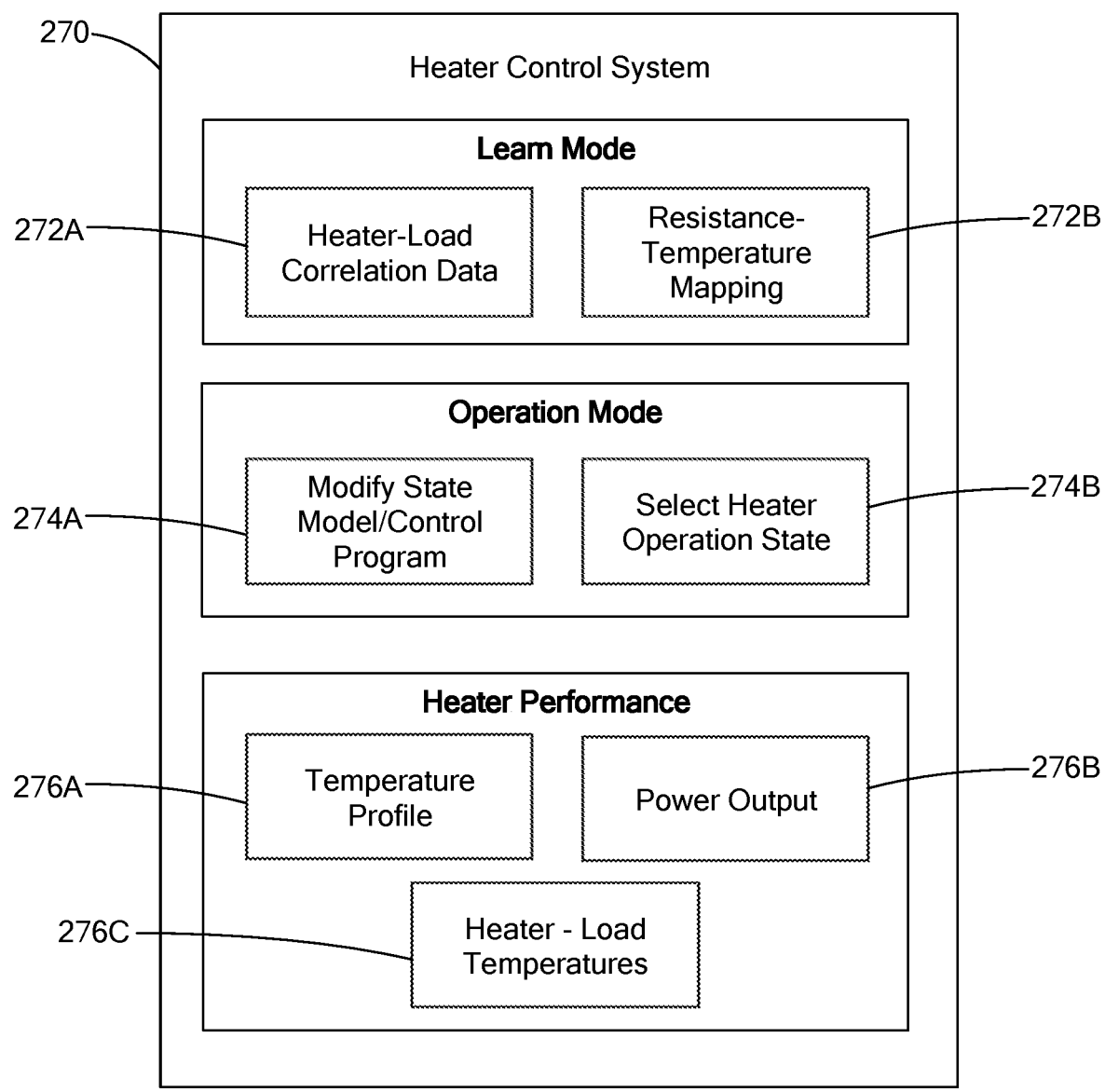
Figure 7:
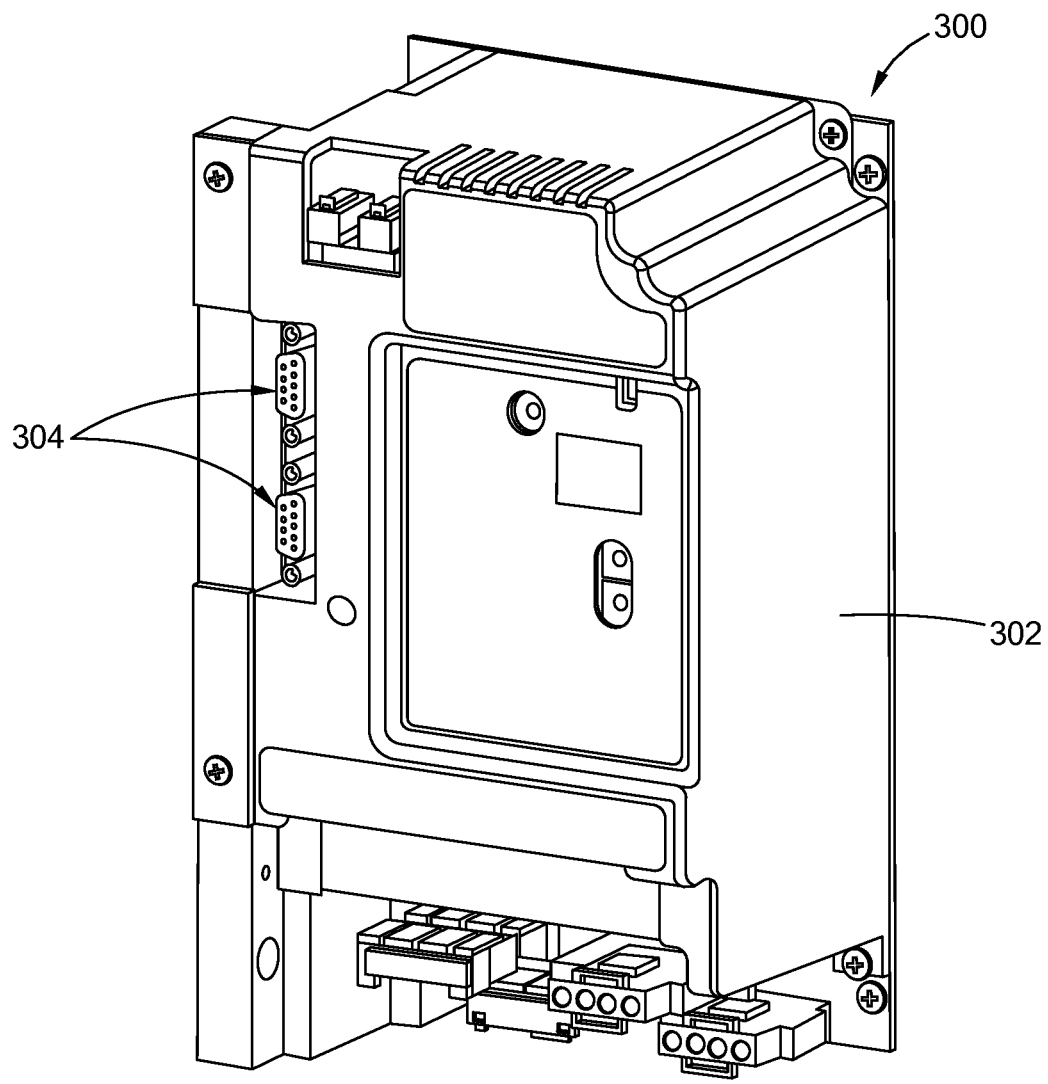
Figure 8:
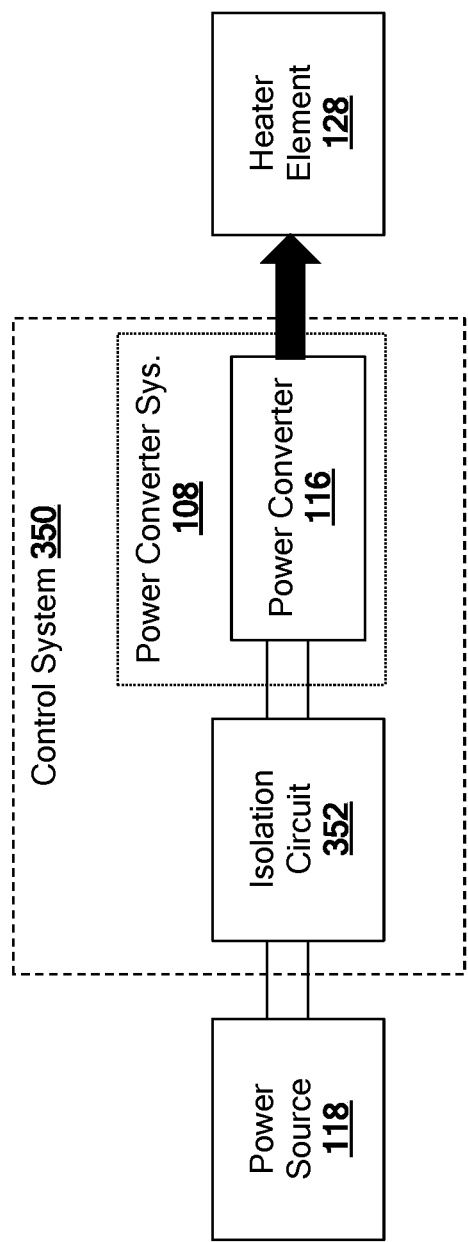
Figure 9:
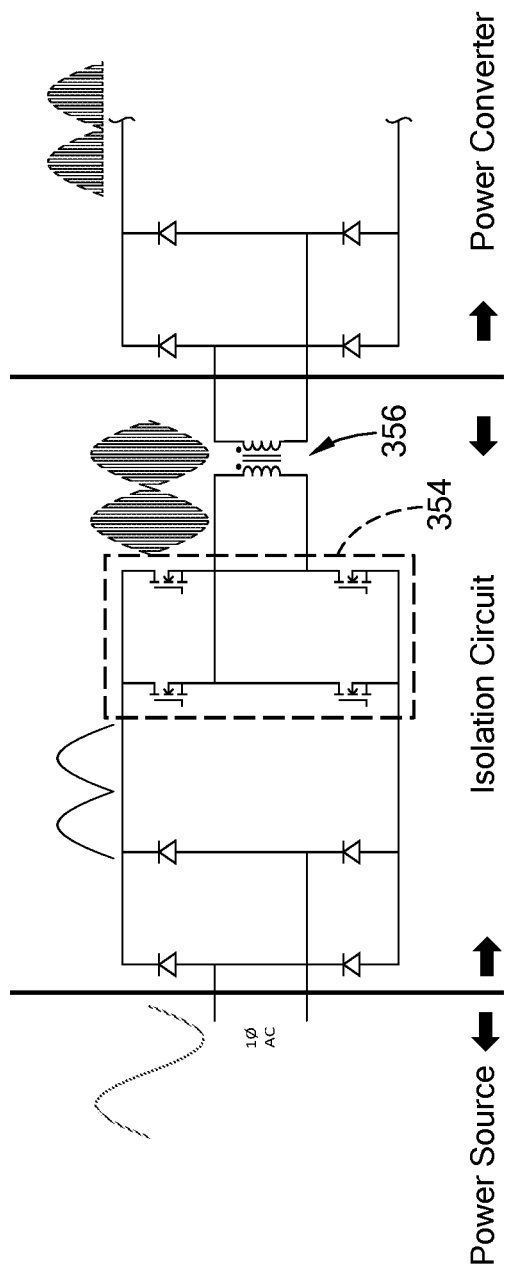

FIG. 4. illustrates an example state model control program defined by multiple state models in accordance with the teachings of the present disclosure;

FIGS. 5A, 5B, 5C, 5D, and 5E illustrate settings for the state models of the state model control program of FIG. 4;

FIG. 6 is an example of main menu graphical user interface in accordance with the teachings of the present disclosure;

FIG. 7 is perspective view of a control system interface in accordance with the teachings of the present disclosure FIG. 8 is a block diagram of a control system having an isolation circuit; and FIG. 9 is an example configuration of the isolation circuit of FIG. 8.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
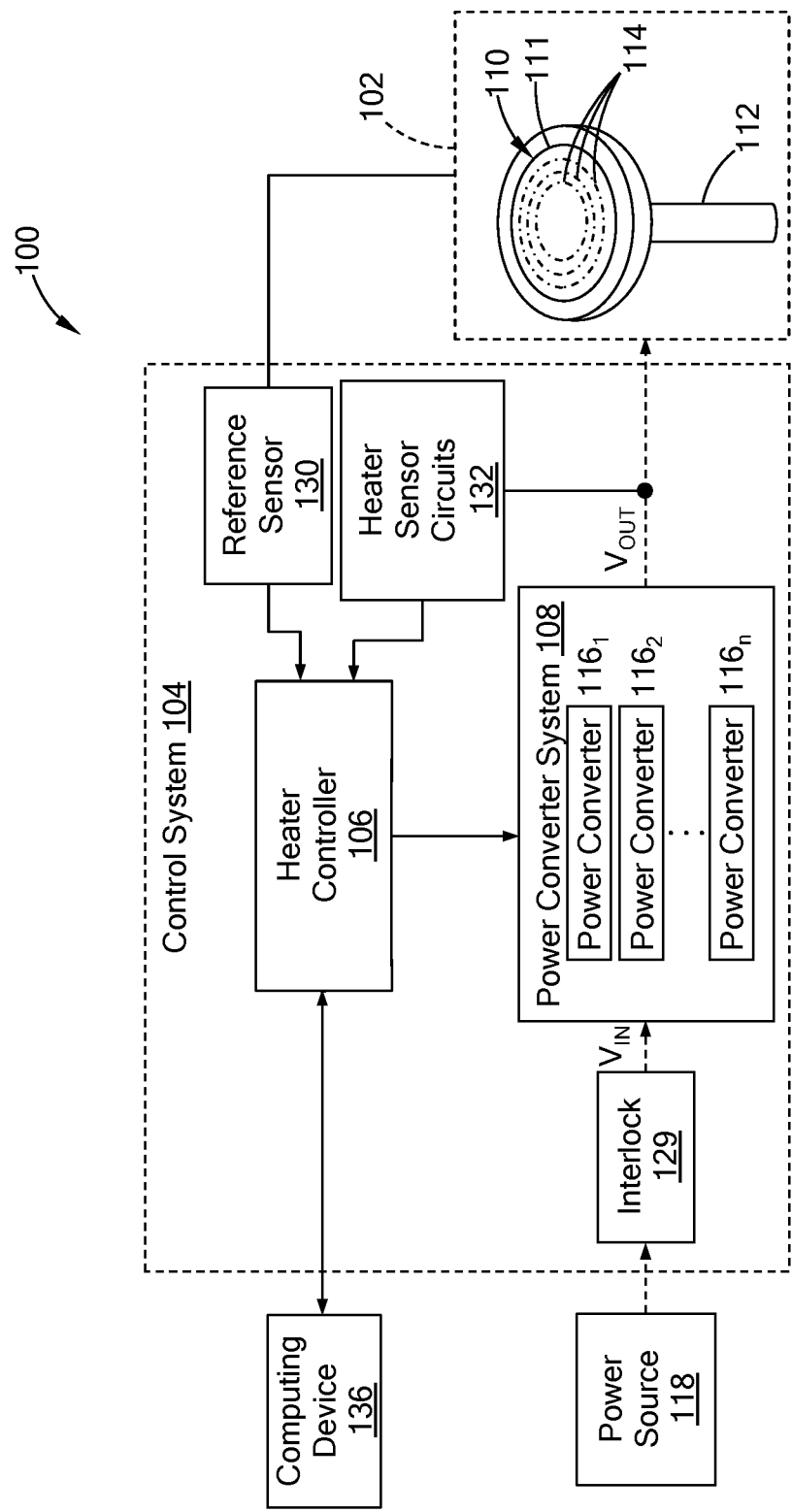
FIG. 1 illustrates a thermal system having a heater and a control system in accordance with teachings of the present disclosure.

Referring to FIG. 1, a thermal system 100 constructed in accordance with the teachings of the present disclosure includes a heater 102 and a control system 104 having a heater controller 106 and a power converter system 108. In one form of the present disclosure, the heater 102 is a pedestal heater including a heating plate 110 and a support shaft 112 disposed at a bottom surface of the heating plate 110. The heating plate 110 includes a substrate 111 and a plurality of resistive heating elements (not shown) embedded in or disposed along a surface of the substrate 111. The substrate 111 may be made of ceramics or aluminum. The resistive heating elements are independently controlled by the controller 106 and define a plurality of heating zones 114 as illustrated by the dashed-dotted lines in the figure. These heating zones 114 are merely exemplary and could take on any configuration while remaining within the scope of the present disclosure.

The heater 102 may be a "two-wire" heater in which changes in resistance can be used by the controller 106 to determine temperature. Such a two-wire system is disclosed in U.S. Pat. No. 7,196,295, which is commonly owned with the present application and the contents of which are incorporated herein by reference in its entirety. In a two-wire system, the thermal system is an adaptive thermal system that merges heater designs with controls that incorporate power, resistance, voltage, and current in a customizable feedback control system that limits one or more these parameters (i.e., power, resistance, voltage, current) while controlling another. As described further below, in one form, with the power converter system 108, the controller 106 acquires a stable continuous current and voltage readings. These readings can then be used for determining resistance, and thus, temperature of the heater 102. In another form, the controller 106 is configured to measure the voltage and/or current at zero-crossing, as described in U.S. Pat. No. 7,196,295.

While the heater 102 is described as a pedestal heater, the control system of the present disclosure can control other types of heaters, such as tubular heaters and heater jackets for fluid lines, and should not be limited to pedestal heaters.

The control system 104 includes components, such as the controller 106, that operate at a lower voltage than, for example, the power converters 116. Accordingly, to protect the low voltage components from high voltage, the control system 104 includes electronic components that isolate the low voltage components from the high voltage components and still allow the components to exchange signal. In FIG. 1, the power lines are illustrated as dashed lines, and data signal lines are provided as solid lines.

The power converter system 108 includes a plurality of power converters 116 ($116_1$ to $116_n$ in figures) that are operable to apply power to the heating elements of the heater 102. More particularly, each power converter 116 is operable to adjust an input voltage (VIN) from a power source 118 to an output voltage ($V_{OUT}$) that is applied to the heating elements of the heater 102, where the output voltage is less than or equal to the input voltage. One example of such a power converter system is described in co-pending application U.S. Ser. No. 15/624,060, filed Jun. 15, 2017 and titled "POWER CONVERTER FOR A THERMAL SYSTEM", which is commonly owned with the present application and the contents of which are incorporated herein by reference in its entirety. In this example, each power converter includes a buck converter that is operable by the controller 106 to generate the desired output voltages ($V_{OUT}$) to one or more heating elements of a given zone.

Figure 2:
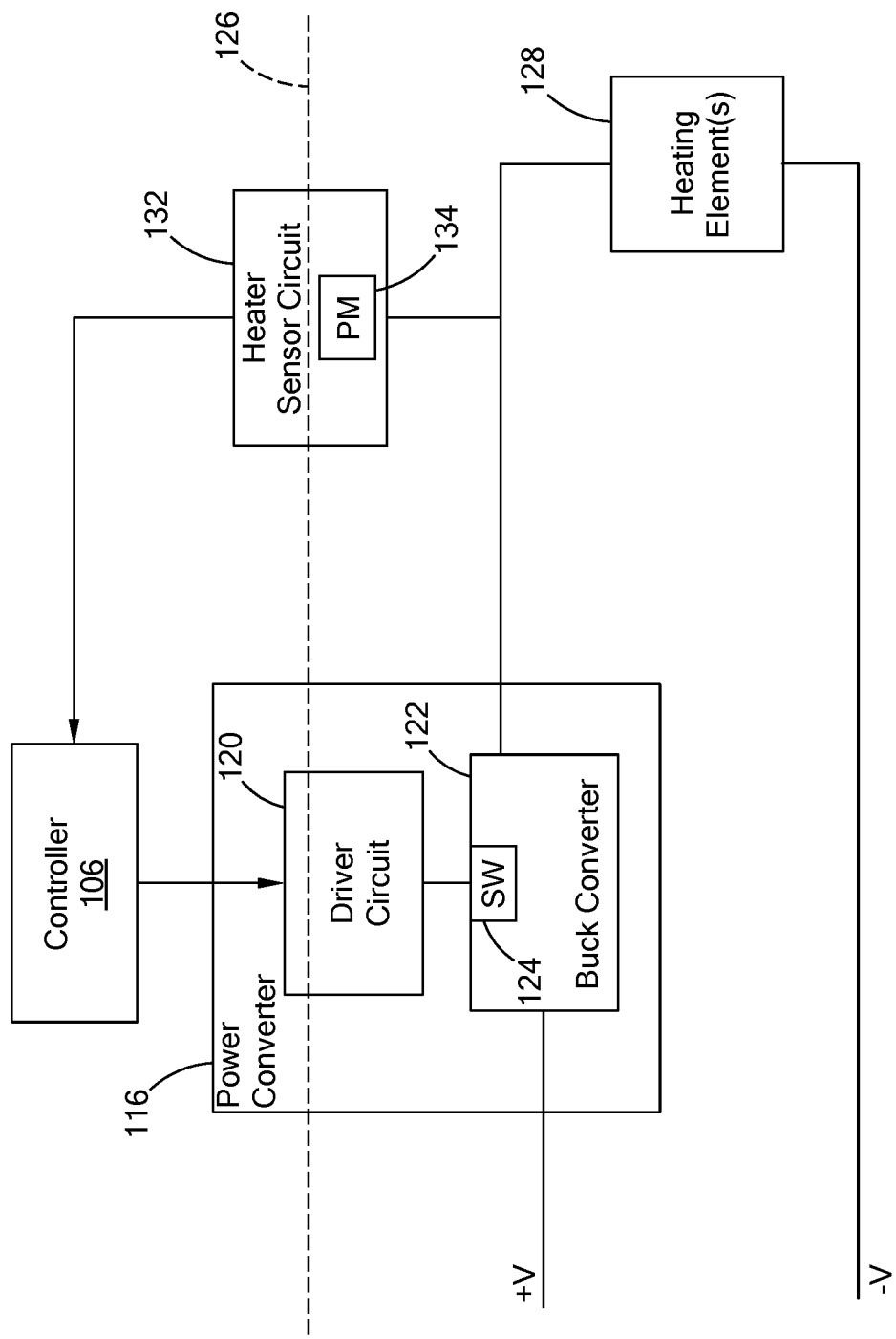
FIG. 2 illustrates a power converter in accordance with teachings of the present disclosure.

More particularly, referring to FIG. 2, a given power converter 116 includes a driver circuit 120 and a buck converter 122 having a control switch 124 ("SW" in figure), which may also be referred to as a power switch. For purposes of illustration, a dashed line 126 represents the isolation of a low voltage section from a high voltage section of the system 100. The driver circuit 120 operates the control switch 124 based on an input signal from the controller 106 to adjust the voltage from the power source 118 and output a reduced voltage to one or more heating elements 128. The driver circuit 120 includes electronics, such as an opto-isolator, a transformer, etc, to communicate with the controller 106 and isolate the controller 106 from the power converter 116. Accordingly, the power converter system 108 is operable to provide a customizable amount of power to each of the heating zones of the heater 102. It should be readily understood, that while specific components are illustrated in FIG. 2, the power converter 116 may include other components while remaining within the scope of the present disclosure.

In one form, the control system 104 includes an interlock 129, such as a relay, to control the power flowing between the power source 118 and the power converter system 108. The interlock 129 is operable by the controller 106 as a safety mechanism to shut-off power from the power source 118 to the power converter system 108, and thus, the heater 102 in the event of an abnormal activity, as described herein.

Referring to FIGS. 1 and 2, to monitor the performance of the heater 102, the control system 104 includes a reference sensor 130 and one or more heater sensor circuits 132. The reference sensor 130 is a distinct sensor that is configured to measure a temperature of a reference area (i.e., reference temperature) about the heater 102. For example, in one form, the reference sensor 130 measures a temperature of a load (e.g., a wafer, a pipe) being heated by the heater 102, where the load is a reference area. In another example, the reference sensor 130 measures the temperature along a surface of the heater 102. The reference sensor 130 may be an infrared camera, a thermocouple, a resistance temperature detector, and/or other suitable sensor for measuring temperature. In addition, multiple reference sensors may be used to detect different areas about the heater 102.

With the use of a two-wire heater, the heater sensor circuits 132 (i.e., sensor circuit) are configured to measure electrical characteristics of the heating elements, which is then used to determine the performance characteristics of the heating elements, such as resistance, temperature, and other suitable information. In one form, a given heater sensor circuit 132 is provided to measure electrical characteristic of one or more heating elements that receive power from a given power converter 116. For example, FIG. 2 illustrates the heater sensor circuit 132 coupled to the electric circuit between the power converter 116 and the heating element 128 to measure the electrical characteristics of the heating element 128. The electrical characteristics includes at least one of an electric current, and a voltage. In one form, the sensor circuit 132 includes a power metering chip 134 ("PM" in figure) to continuously measure current and/or voltage regardless of the power being applied to the heating element. The sensor circuit 132 may also include other electronics, such as isolated analog-to-digital converters, opto-isolators, or transformers, among others, for transmitting signals between the low and high voltage sections of the system. The sensor circuit 132 may be configured in other suitable ways, such as the sensor circuit described in U.S. Ser. No. 15/624,060, while remaining within the scope of the present disclosure.

Data from the reference sensor 130 and/or the sensor circuit(s) 132 is provided to the heater controller 106 for further processing to control the operation of the heater 102. In one form, the heater controller 106 is communicably coupled to an external device, such as a computing device 136, that is operable by a user to exchange information with the control system 104. For example, the computing device 136 may be desktop computer, a tablet, a laptop, etc, that is communicably coupled to the controller 10 via a wireless communication link (e.g., WI-FI, Bluetooth, etc) and/or wired communication. In one form, the controller 106 is configured to exchange information with the computing device 136 by way of one or more graphical user interfaces (GUIs). The GUIs can be configured in various suitable ways for relaying information related to control and operation of the heater 102, such as operation state, temperature profile, electrical characteristics of the heater, and other suitable information), and for receiving inputs from the user, such as set-points (e.g., temperature, power), operation variables (e.g., rate of change, PID variables), and selection of control state of the heater 102 (e.g., learn mode, calibration, manual control, state control program).

The controller 106 includes electronics including one or more microprocessors and a memory (e.g., RAM, ROM, etc) that stores computer readable instructions (i.e., software programs) executed by the microprocessor. The controller 106 is configured by way of predefined computer readable instruction to perform one or more control processes such as: heater learn state, state model control, system protection monitoring, and/or other suitable processes described herein.

Figure 3:
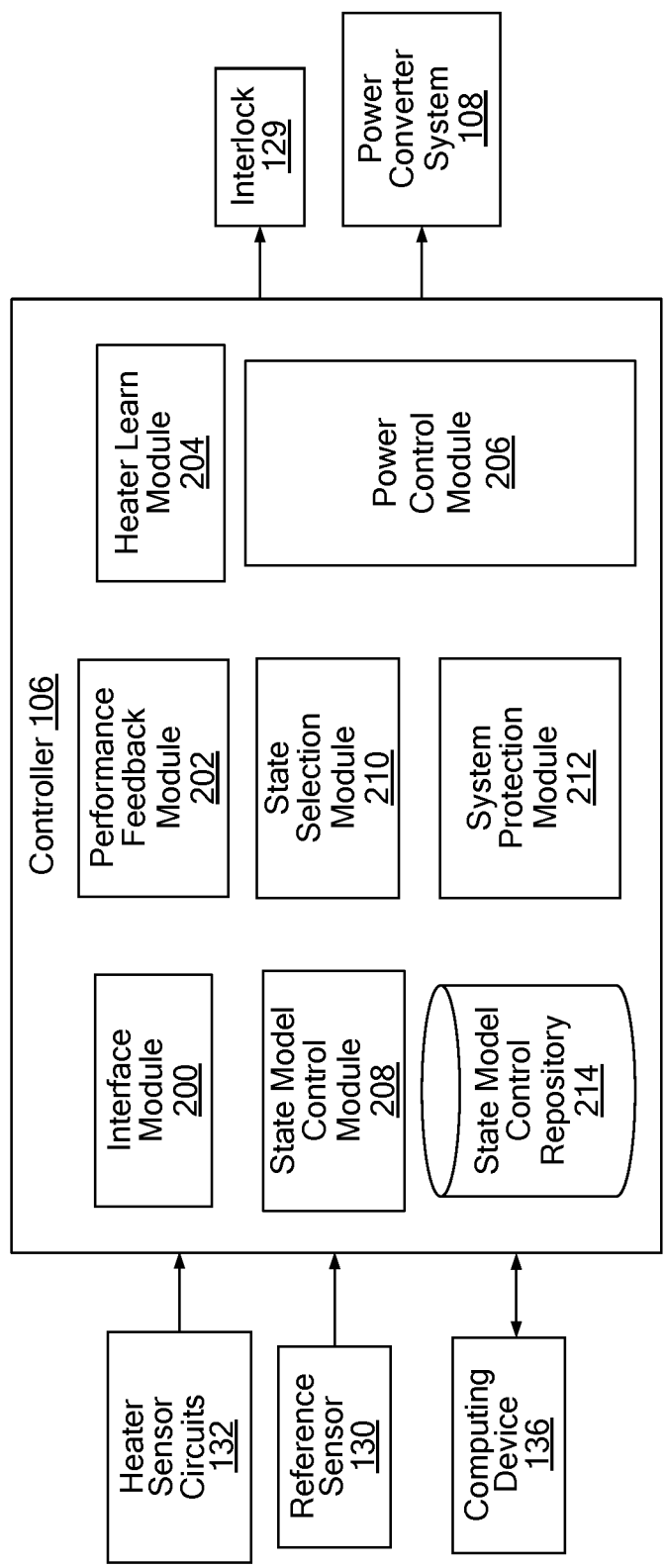
FIG. 3 is a block diagram of the control system of FIG. 1.

Referring to FIG. 3, in one form, the controller 106 is configured to operate as an interface module 200, a performance feedback module 202, a heater learn module 204, a power control module 206, a state model control module 208, a state selection module 210, and a system protection module 212. The interface module 200 is configured to communicate with one or more external devices, such as the computing device 136. With respect to the computing device, the interface module 200 is configured to display GUIs that displays various control options and system performance information provided by the other modules of the controller 106 to the user. If the user selects a control option, the interface module 200 transmits data to the respective module of the controller 106.

The performance feedback module 202 is configured to measure the electrical response from the reference sensor 130 and the heater sensor circuits 132 to determine the reference temperature and the heater temperature (i.e., primary temperature in claims). For example, based on the electrical characteristics of the sensor circuits 132, the performance feedback module 202 determines the average resistance of a respective heating element and then using predetermined information that correlates resistance to temperature, determines the temperature of the heating element. The performance feedback module 202 is configured to determine the reference temperature based on the type of reference sensor 130 being used. For example, if the reference sensor 130 is an RTD, the feedback module 202, includes predetermined information associates the resistance to temperature, and uses this information to determine the temperature of the reference area.

In one form, the heater learn module 204 is configured to form one or more types of correlation data that associate two or more parameters with each other, and are later used to determine the value of one parameter based on the measured value of another. For example, the learn module 204 is configured to construct a performance map of the heater 102 that correlates the performance of the heater 102 with the load being heated. Specifically, the temperature of the heater 102 (i.e., temperature of the heating elements) is different than the temperature at the surface of the heater 102 and from the temperature of the load placed on the heater 102. In one form, the heater learn module 204 generates a heater-load temperature correlation data that provides the temperature of the heater 102 (i.e., heater temperature) and the amount of time needed for the load to reach a set-point temperature based on the heater temperature and power being applied to the heater 102. For example, if the heater temperature is 500° C., and the load temperature is at 470° C., which is an offset of 30° C., the heater-load temperature correlation data is used to determine the appropriate heater temperature for increasing the load temperature to, for example, 490° C. within a desired time period.

To generate the heater-load temperature correlation data, the heater learn module 204 is configured to perform a heater learn routine during which the heater 102 has a load or an artifact disposed thereon for heating. The learn module 204 operates the heater 102 in accordance with a preset operation sequence that has the power control module 206 gradually increase the power to the heater 102 to increases the heater temperature. The heater learn module 204 obtains the average temperature of each of the heating elements and the reference temperature from the performance feedback module 202.

Using the temperature of the heating elements, the learn module 204 obtains the overall heater temperature and correlates the power applied, the duration of the heating operation, and the heater temperature. In addition, the heater learn module 204 correlates the power applied, duration of the routine, and the measured reference temperatures. Using the two-correlation data, the heater learn module 204 correlates the primary temperatures (i.e., heater temperatures) with respective reference temperatures over change in power and time to form the heater-load correlation data. In one form, the heater learn routine may be performed at any time to construct and even update the correlation data.

The heater learn module 204 may be configured in other suitable ways. For example, in lieu of measuring the load temperature, the module 204 may measure the surface of the heater 102 using the reference sensor 130 to correlate the heater and surface temperatures. A predefined algorithm may be used to estimate the temperature of the load based on the surface temperature to obtain the heater-load correlation data.

In one form, the heater-load correlation data is utilized by one or more state model controls, including but not limited to a rate and manual controls, to perform a boost compensation to increase the rate at which the load temperature increases. Specifically, using the correlation data, the controller 106 knows the amount of time it takes the heater 102 to reach a specific temperature and determines what the heater temperature should be and for how long for the load temperature to reach a desired temperature. Thus, the controller 106 can increase the rate at which the load temperature increases.

In addition to or in lieu of the heater-load correlation data, the heater learn module 204 is configured to perform an auto learning resistance-to-temperature curve control to autonomously generate the resistance-to-temperature mapping table for the two-wire system. One example of determining resistance to temperature curve is described in the two-wire system disclosed in U.S. Pat. No. 7,196,295. Generally, a resistance of the wire is determined based on a base resistance at a reference temperature, a TCR for the particular material used for the two-wire, and temperature. The two-wire system can determine the resistance based on the voltage and/or current, and then the temperature can be determined by using the resistance, the base resistance, and the TCR. The resistance-to-temperature curve can be adjusted based on, for example, any added resistance from leads or offsets found between a reference temperature and the two-wire system.

The power control module 206 is configured to operate each of the power converters based on a power output command for each converter 116. In one form, the power output command can be provided by at least one of the heater learn module 204, the state selection module 210, and the system protection module 212. In one form, the power control module 206 outputs a control signal to the driver circuit 120, which in return operates the control switch 124 of a respective power converter 116 to adjust the input voltage to the desired output voltage for a designated heating element(s).

The state model control module 208 and the state selection module 210 are configured to construct state model controls and select a given state model to operate the heater 102. In one form, the state model control module 208 is configured to store one or more state models in a state model control repository 214, and to modify or construct new state models based on an input from the user. For example, table 1 below provides examples of different state models that are computer executable programs for controlling the heater 102 within set conditions. While specific examples are provided, other state models may be used while remaining within the scope of the present disclosure.

TABLE 1

Example State Models
State Models

| | |
|---|---|
| Idle Control | No power is being supplied to the heater. |
| Power-Up Control | A low amount of power (e.g., 2%) is applied to the heater until the heater sensor circuits measure voltage and/or current. |
| Soft-Start Control | The power is increased at a low ramp rate until the resistance of the heating elements is greater than a resistance set point. |
| Set Rate Control | The heater and/or load temperature is increased at a set ramp rate. The set ramp rate can be adjusted based on the heater-load correlation data. |
| Steady-State Control (i.e., PID) | The heater temperature is controlled to a specific set point using, for example, a continuous proportional-integral-derivative control algorithm (i.e., a PID control). This model can be configured to implement coherence variance in which variation between different heating zones is minimized or maintained within a set tolerance. |
| Manual Control | The user manually controls the heater. |

In one form, the state model controls are defined by one or more operation settings for controlling the heater 102 for the respective state model control. For example, table 2 provides various settings that may be used to define a state model control. While specific examples are provided, other settings may also be used and are within the scope of the present disclosure.

TABLE 2

Example Operation Settings for State Model Controls

| SETTING TYPE | EXAMPLES |
|---|---|
| Rate of Change: | Increase/decrease power (e.g., % power/min); rate increase/decrease in temperature (e.g., Δ° C./min) |
| PID Variables: | Defining variables for PID control algorithm (e.g., gain, P, I, and/or D) |
| Transition Condition for Entering or Exiting Model: | User increases/decreases a set-point (e.g., temperature set-point, power set-point etc); the heater temperature is below or above a set-point by a predefined amount; heater and/or reference temperature above or below state model threshold; time period for performing state has lapsed or started; new load entering system |
| Model Entry Action | Upon entry into state model, adjust integral for PID control (e.g., shift I by X %, shift I to value X; scale I by N, shift I and P) |
| Offset Adjustment | Adjust offset between load temperature and heater temperature based on updated correlation (e.g., heater learn module updated correlation data) |
| Ignore Reference Sensor | For certain models the input from the reference sensor may be ignored (e.g., ignoring reference sensor input during plasma operation) |

Different setting may be used to define different state models, and different variations of the same type of state model may also be defined. For example, FIG. 4 illustrate a state model control program 250 that is defined by six different state models that include: a power-up control 252, a soft-start control 254, a rate control 256, and three PID controls 258, 260, 262 (i.e., steady-state control). FIG. 4 illustrates the transition of a given state model to another state model of the control program 250.

Each state model is defined by one or more setting that may be fixed or adjustable by the user via the computing device 136. For example, FIGS. 5A to 5E illustrate setting for state models 1 to 5 of the state model control program 250 of FIG. 4. The type and/or number of settings that may be adjustable by the user can be customized based on the use of the thermal system 100, and therefore, it is within the scope of the present disclosure that any number of the setting may be adjustable or fixed.

FIG. 5A illustrates the settings for the power-up control 252, which includes: a power set-point for performing power-up at 2%/min; and a transition condition to move to state model 2 (soft-start control 254) when the electrical characteristics of the heater elements ($H_{EC}$) is greater than a power-up threshold ($TH_{PWR-UP}$), which may be predefined or adjustable by the user. FIG. 5B illustrates the setting for the soft-start control 254 which includes: a rate setting of 0.5% power/min, with an initial power of 0% and a max power of 5%; and a transition condition to exit the control 254 to state model 3 (rate control 256) when the voltage output ($V_{O/P}$) is greater than 5%. FIG. 5C illustrates the setting for the rate control 256 which includes: a rate set-point of 12° C./min; a proportional band (PB) of 200° C., an integral gain (Ti) of 30 sec, and a derivative gain of (Td) of 0 sec; a start action that is selectable but is currently set to none; a transition condition to move to state model 4 (PID-1 258) when the system is close to the power set-point (SP) at a relative parameter (Rel. Param 1) of 1° C. FIGS. 5D and 5E illustrate the setting for state model controls 4 and 5 (i.e., PID-1 258 and PID-2 260) respectively, and both are PID controls that are assigned different settings. Along with other setting, state model control 4 includes two exit conditions in which: the first condition transitions to state model 3 (i.e. rate 256) when the temperature set-point increases by a relative parameter of 10° C. (Rel. Param 1); and the second condition transitions to state model 5 (PID-2 260) if the set-point decreases by a relative parameter of 10° C. (Rel. Param 2). Similarly state model control 5 also includes two exit conditions in which: the first exit condition transitions to state model 6 (PID-3 262) when the system is far from the set-point (e.g., +/−5° C.), and the second exit condition transitions to state model 4 (PID-1 258) after a predetermined time has lapsed.

FIGS. 5A to 5C illustrate example settings for different state models for a specific control program. It should be readily understood that other setting may be used for the different state models. In addition, the state control program may be defined by two or more state models, and should not be limited to the example provided herein. In addition, the controller 106 may be configured to include more than one state control program for controlling the operation of the heater 102. Accordingly, different state model control programs can be created to accommodate different types of loads, heaters, and performance criteria.

In one form, by way of the computing device 136, the user selects a control operation from among the stored state control model(s) and state control program(s), as a selected heater operation state. The state selection module 210 is configured execute the selected heater operation state, which is stored in the repository 214, based on the information from the performance feedback module 202 and the settings defined for the state model(s) provided in the selected heater state operation. In operation, the state selection module 210 determines a desired power level for each of the heating zones 114 to satisfy the conditions of the state model being performed, and outputs the power level to the power control module 206. Using the feedback information from the sensors 130 and 132, the state selection module 210 can adjust the power to the heater 102.

Accordingly, the state model control module 208 and state selection module 210 allow the user to dynamically change the control scheme for a given state model control to develop control programs (i.e., fingerprint) for a specific heater. For example, when transitioning from one state to another, the integral, which is the static power level, can be set by the user to a set value or can be conditioned on a variable like temperature. Thus, the state based model control can be tuned for each heater and is not a fixed control scheme for all heaters.

The system protection module 212 is configured to monitor the thermal system 100 for abnormal activity that may damage the heater 102 and/or control system 104. In one form, the system protection module 212 performs at least one of the following protection protocols: zone-to-zone monitoring; zone-to-reference monitoring; rate of change gauge, and/or energy limit control.

The zone-to-zone and zone-to-reference monitoring are examples of coherence control to assess whether the thermal system 100 is maintaining a desired equilibrium along the heater 102 and to minimize or prevent damage to the heater 102, such as ceramic breakage. For example, for the zone-to-zone monitoring, the protection module 212 determines the temperature of the heating zones 114 based on information from the performance feedback module 202, and determines whether the difference in temperature between adjacent zones exceed a temperature variance threshold (e.g., 10° C. difference). If so, the protection module 212 performs a protective measure for minimize or prevent damage to the thermal system 100.

The zone-to-reference monitoring compares the average temperature of the heater 102 with the reference temperature to determine if the temperature between the two exceeds a temperature variance threshold, which may be the same as or different from the one used for zone-to-zone monitoring. Accordingly, the coherence control can prevent the thermal system 100 from exceeding variance threshold by, for example, adjusting power to the heater 102 or shutting down the system.

Another indicator for possible abnormal operation of the thermal system 100 is in the rate at which the heater 102 is heating based on the power being applied. Specifically, in one form, the rate at which the heater temperature and/or electrical response of heater 102 changes based on the power being applied is compared to an associated rate range threshold to determine whether the heater 102 is responding within specification. For example, if the heater temperature is not increasing when the power applied increases or if the heater temperature suddenly increases when the power applied is the same or slightly increases, the protection module 212 flags such activity as being abnormal and performs a protective measure. Similarly, the energy limiting control sets a limitation on the amount of power that can be applied to the heater 102, and the protection module 212 outputs a protective measure if the thermal system 100 exceeds and/or approach those limits. For example, the energy limiting control is used to set the maximum current during low resistance startup, and the maximum power delivered. The maximums can be set by the user or is predetermined based on the specification of, for example, the heater 102, and can vary over a temperature range.

The protective measure performed by the system protection module 212 includes, but is not limited to: instructing the power control module 206 to reduce power to one or more heating zones 114 to control the variation, shut-off power to the heater 102, output a message to the computing device 136 regarding the significant temperature variance, and/or turn-off power supplied to the power converter system 108 by operating the interlock 129.

The controller 106 may be configured in various suitable ways for performing the operations of the interface module 200, the performance feedback module 202, the heater learn module 204, the power control module 206, the state model control module 208, the state selection module 210, and the system protection module 212. For example, in one form, the controller 106 is operable in a learn mode to form the heater-load correlation data and/or the resistance-to-temperature mapping table, and in an operation mode to modify the state control models and/or execute a selected heater operation state. In one form, the controller 106 monitors the system 100 for abnormal activity once power is applied to the heater 102.

Referring to FIG. 6, to select between such modes, the controller 106 is configured to display, for example, a main menu GUI 270 via the computing device 136. In this example, the various control options are provided as buttons (e.g., learn mode buttons 272A and 272B and operation mode buttons 274A and 27B). The activation of a given button, prompts the controller 106 to execute one or more programs to perform the particular task selected which may include generating additional GUIs for requesting additional information task selected.

In addition to operating the controller 106 in the learn mode or the operation mode, the controller 106 is operable to display information related to the heater performance. For example, the heater performance may include but is not limited to: a temperature profile (i.e., button 276A) along the surface of the heater 102 to show the temperature at the various zones; a power output graph (i.e., button 276B) that provides the amount of power, current, and/or voltage being applied to the heater 102; and a heater-load temperatures chart (i.e., button 276C) for depicting the heater temperature and the load temperature over time during the heating operation. It should readily understood that the controller 106 can be configured to output other heater performance information. While FIG. 6 illustrates an specific example of main menu GUI, other GUIs may be used while being within the scope of the present disclosure.

The control system 104 may be implemented in various structural configurations. For example, in one form, FIG. 7 illustrates a control system interface 300 that includes a case 302 for housing the controller, the interlock, the power converter system, and the sensor circuits. The interface 300 also include one or more communication ports 304 for connecting to one or more external devices such as the computing device. Based on the type of reference sensor 130 used, the interface 300 also includes an auxiliary port (not shown) for receiving inputs from the reference sensor 130 and includes power ports (not shown) for connected to the heating elements of the heater 102.

Referring to FIGS. 8 and 9, in one form, to protect the control system from high AC power from the power source, the control system of the present disclosure includes an isolation barrier between the power source and the power converter(s). More particularly, a control system 350 includes an isolation circuit 352 disposed between the power source 118 and the power converter(s) 116 of the power converter system 108. While not illustrated, the control system 350 is configured to include the other components of the control system 104, such as the heater controller, the interlock, the heater sensor circuits, etc.

Along with other components, the isolation circuit 352 includes a RMS (root-mean-square) control circuit 354 that controls the bridge duty cycle to control output RMS, and a direct current (DC) transformer 356. The isolation circuit 352 electrically isolates the power converters from the incoming line power. The output is floating from Earth/Ground and L1/L2/L3.

The description of the disclosure is merely exemplary in nature and, thus, variations that do not depart from the substance of the disclosure are intended to be within the scope of the disclosure. Such variations are not to be regarded as a departure from the spirit and scope of the disclosure.

As used herein, the phrase at least one of A, B, and C should be construed to mean a logical (A OR B OR C), using a non-exclusive logical OR, and should not be construed to mean "at least one of" A, at least one of B, and at least one of C.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

What is claimed is:

1. A control system for controlling a heater, the heater including at least one heating element, the control system comprising:

a power converter operable to supply a voltage output that is adjustable to the heater, wherein the power converter is configured to convert a voltage input from a power source to the voltage output that is less than or equal to the voltage input;

a sensor circuit configured to measure an electrical characteristic of the heating element of the heater, wherein the electrical characteristic includes at least one of an electric current and a voltage;

a reference temperature sensor measuring a reference temperature of a reference area at the heater; and a controller configured to operate the power converter to control the voltage output to the heater, wherein:

the controller includes a processor and a memory;

the controller is configured to operate in at least one mode from a plurality of modes stored in the memory, the plurality of modes including an operation mode and a learn mode, the controller is configured to calculate a primary temperature of a heater element based on the electrical characteristic and determines the voltage output to be applied to the heater based on the at least one mode and on at least one of the reference temperature and the primary temperature, and the controller is configured to execute one or more protection protocols when the voltage output is being supplied to the heater.

2. The control system of claim 1, wherein the controller is configured to reduce or shut-off power to the heater in response to a difference between the reference temperature and the primary temperature being greater than a preset threshold.

3. The control system of claim 1, wherein the reference temperature sensor is one of an infrared camera, a thermocouple, and a resistance temperature detector.

4. The control system of claim 1, wherein, in the learn mode, the controller is configured to operate the heater to generate a heater-load correlation data that associates a temperature of a heater element with a temperature of a load positioned on the heater.

5. The control system of claim 4, wherein, in the learn mode, the controller is configured to gradually increase power to the heater to increase the heat generated by the heater, determine a plurality of the primary temperatures, and correlate the primary temperatures with respective reference temperatures detected by the reference temperature sensor to generate the heater-load correlation data.

6. The control system of claim 5, wherein the controller is configured to map a change of the primary temperature and the reference temperature over a period time during which the power is being increased.

7. The control system of claim 1, wherein the reference temperature sensor is configured to measure a temperature of at least one of a load positioned on the heater and a surface of the heater.

8. The control system of claim 1, wherein, in the operation mode, the controller is configured to execute a boost compensation to increase a rate at which the heating elements heat the reference to a predefined set-point temperature.

9. The control system of claim 1, wherein the controller is configured to determine the primary temperature for each of the heating elements based on the electrical characteristic, and for adjacent zones, adjust power supplied to one or more heating elements of the adjacent zones based on the primary temperatures to control temperature variation across the heater.

10. The control system of claim 9, wherein the controller is configured to reduce power to one zone in response to the one zone having a higher temperature than that of an adjacent zone.

11. The control system of claim 1, wherein, in the operation mode, the controller is configured to select a state model control, as an operation state of the heater, from among a plurality of defined state model controls, based on at least one of the reference temperature and the primary temperature.

12. The control system of claim 11, wherein the plurality of defined state model controls includes at least one of a power-up control, a soft start control, a set rate control, and a steady-state control.

13. The control system of claim 11, wherein each of the state model controls defines one or more operation settings for controlling the heater for the respective state model control.

14. The control system of claim 13, wherein the one or more operation settings includes a transition condition that defines a condition for exiting the operation state to one other state model control.

15. A thermal system comprising:
a heater; and
the control system of claim 1.

* * * * *